(12) United States Patent
Meng et al.

(10) Patent No.: US 11,908,657 B2
(45) Date of Patent: Feb. 20, 2024

(54) SCANNING ELECTRON MICROSCOPE DEVICE AND ELECTRON BEAM INSPECTION APPARATUS

(71) Applicant: ZHONGKE JINGYUAN ELECTRON LIMITED, Beijing (CN)

(72) Inventors: Qinglang Meng, Beijing (CN); Weiqiang Sun, Beijing (CN)

(73) Assignee: Zhongke Jingyuan Electron Limited, Beijing (CN)

( * ) Notice: Subject to any disclaimer, the term of this patent is extended or adjusted under 35 U.S.C. 154(b) by 0 days.

(21) Appl. No.: 17/646,195

(22) Filed: Dec. 28, 2021

(65) Prior Publication Data

US 2023/0005704 A1    Jan. 5, 2023

(30) Foreign Application Priority Data

Jul. 1, 2021    (CN) .......................... 202110746460.9

(51) Int. Cl.
*H01J 37/21*    (2006.01)
*G01N 23/2251*    (2018.01)
(Continued)

(52) U.S. Cl.
CPC .......... *H01J 37/21* (2013.01); *G01N 23/2251* (2013.01); *H01J 37/141* (2013.01);
(Continued)

(58) Field of Classification Search
CPC .. H01J 37/00; H01J 37/02; H01J 37/26; H01J 37/28; H01J 37/21; H01J 37/141;
(Continued)

(56) References Cited

U.S. PATENT DOCUMENTS

2007/0023654 A1* 2/2007 Kamimura .......... H01J 37/3177
250/492.1
2019/0189389 A1* 6/2019 Uemura .................. H01J 37/10
(Continued)

*Primary Examiner* — Jason L McCormack
(74) *Attorney, Agent, or Firm* — Benesch, Friedlander, Coplan & Aronoff, LLP

(57) ABSTRACT

A scanning electron microscope device for a sample to be detected and an electron beam inspection apparatus are provided, the scanning electron microscope device being configured to project electron beam to a surface of the sample to generate backscattered electrons and secondary electrons, and comprising: an electron beam source, a deflection mechanism, and an objective lens assembly. The deflection mechanism comprises a first deflector located downstream the electron beam source and a second deflector located downstream the first deflector. The objective lens assembly comprises: an excitation coil; and a magnetic yoke, formed by a magnetizer material as a housing which opens towards the sample and comprising a hollow body defining an internal chamber where the excitation coil is accommodated, and at least one inclined portion extending inward from the hollow body at an angle with reference to the hollow body and directing towards the optical axis, with an end of the at least one inclined portion being formed into a pole piece. The deflection mechanism further comprises a compensation electrode, which is located between the pole piece and the surface of the sample and is configured to adjust a focusing position of the electron beam at which the electron beam is focused, in a condition of excitation thereof with a voltage being applied thereon, by adjusting the voltage.

18 Claims, 4 Drawing Sheets

(51) Int. Cl.
   *H01J 37/141*   (2006.01)
   *H01J 37/147*   (2006.01)
   *H01J 37/26*    (2006.01)
   *H01J 37/28*    (2006.01)

(52) U.S. Cl.
   CPC ........ *H01J 37/1477* (2013.01); *H01J 37/263* (2013.01); *H01J 37/28* (2013.01); *H01J 2237/06375* (2013.01); *H01J 2237/141* (2013.01); *H01J 2237/1415* (2013.01); *H01J 2237/1516* (2013.01); *H01J 2237/2448* (2013.01); *H01J 2237/24475* (2013.01); *H01J 2237/2817* (2013.01)

(58) Field of Classification Search
   CPC ...... H01J 37/1477; H01J 37/263; H01J 37/06; H01J 37/244; H01J 2237/06375; H01J 2237/141; H01J 2237/1415; H01J 2237/1516; H01J 2237/24475; H01J 2237/2448; H01J 2237/2817; H01J 2237/1534; G01N 23/2251
   USPC ................................. 250/306, 307, 310, 311
   See application file for complete search history.

(56) References Cited

U.S. PATENT DOCUMENTS

2021/0110994 A1* 4/2021 Li ........................ H01J 37/1477
2021/0319977 A1* 10/2021 Liu ....................... H01J 37/244

* cited by examiner

SCANNING ELECTRON MICROSCOPE DEVICE AND ELECTRON BEAM INSPECTION APPARATUS

CROSS-REFERENCE TO RELATED APPLICATION

The present disclosure claims the benefit of Chinese Patent Application Invention No. 202110746460.9 filed on Jul. 1, 2021 in the China National Intellectual Property Administration, the whole disclosure of which is incorporated herein by reference.

BACKGROUND

Field

Embodiments of the present disclosure generally relate to the technical field of scanning electron microscope, and more particularly to a scanning electron microscope device and an electron beam inspection apparatus.

Description of Relevant Art

In semiconductor manufacturing processes, microchip(s) or integrated circuit (ICs) can be manufactured on a wafer. Processes of manufacturing IC involve several stages, comprising, for example, a design stage, a manufacturing stage and an inspection stage. The design stage involves designing both structure and arrangement of circuit components for IC. The manufacturing stage may comprise a plurality of operations, such as lithography, etching, deposition, chemical mechanical planarization (CMP), and the like. During the manufacturing stage, in a "patterning" process thereof, geometric features (e.g., patterns) on a mask or a reticle may be transferred to a surface of the wafer. A wafer formed with geometric features thus transferred may be referred to as a "patterned wafer". In the inspection stage, the IC thus manufactured can be inspected for quality control.

Defects may be incurred during the manufacturing stage. For example, the surface of the wafer may be provided with defects, or the mask may be provided with defects that can be further transferred to the wafer. Therefore, it is advantageous to check for potential defects in the wafer and/or the mask (e.g., in appropriate processing operations) during the inspection stage. Results of the inspection may be used to improve or adjust the design stage, the manufacturing stage, the inspection stage or any combination thereof. In general, "patterned substrate" (or abbreviated as "substrate" in the context, without introducing any confusion herein) may be used to represent a wafer, a mask, a reticle, or any structure having a pattern thereon. As semiconductor devices becomes more and more miniaturized in recent years, detection and critical dimension measurement for objects such as substrates (e.g., wafers, or masks, or reticles) become increasingly important.

In the field of electron beam inspection (EBI) for semiconductors, both detection speed and throughput are very demanding, and size of available field of view (FOV) of a single frame scanning image determines maximum detection efficiency of the apparatus. As it is expected to achieve components of smaller size in IC manufacturing process so as to achieve higher performance density, then, it becomes a challenge in semiconductor manufacturing to detect defects of relatively small size. Imaging techniques are typically used to inspect defects on patterned substrates. When design rules are reduced (e.g., below 20 nm), high-throughput inspection system (e.g., optical inspection system) may face the challenge of insufficient sensitivity for finding defects (e.g., physical defects). In addition, the optical inspection system may not be able to detect electrical defects buried below the surface.

Therefore, a high-resolution inspection systems, e.g., an electron beam inspection (EBI) system or a charged particle beam imaging system, becomes more and more important in defect detection, especially for electrical defects and minor physical defects. Electron beam inspection apparatus is typically used for defect detection in the production process of semiconductor devices, and its main principle is to bombard the surface of the sample which is being detected with high-energy electron beam, detect both secondary electrons (SE) and backscattered electrons (BSE) generated in a bombarded area of the surface of the sample which area is bombarded, and obtain various physical and chemical information of the sample itself which is being detected, such as topology, composition thereof, etc. Applications of electron beam detection device are typically, for example, based on detection and critical dimension measurement of microscopic patterns on semiconductor silicon wafer and mask with electron beam in vacuum. Electron beam inspection apparatus (comprising scanning electron microscope and the like) is typically used in application scenarios such as semiconductor silicon wafer pattern defect detection with electron beam, and the like. As such, with continuous refinement of semiconductor processes, optical inspection has gradually been unable to meet the detection requirements, and electron beam inspection has been applied more and more widely.

However, electron beam inspection also has inherent defects, for example, although it may be helpful to optimize the resolution by improving energy of the electron beam (e.g., from 10 kV to 100 kV), it brings about some other problems, such as high voltage resistance issue and power supply stability issue, and the like. Most importantly, in the semiconductor field, an unrecoverable damage to the wafer may be readily brought about by electron beam having high-energy, which is not allowed. Therefore, in the field of semiconductor detection, typically, the energy of electron beam would not be much too high. Moreover, a deceleration mode at the sample which is typically used to effectively control landing energy of the electron beam impinging on the wafer, is widely used in the semiconductor field at present. The disadvantage of the deceleration mode lies in that an existence of the deceleration electric field will increase off-axis aberration of the electron beam and reduce the resolution of relatively large field of view, thus affecting operation efficiency of the electron beam detection apparatus.

Moreover, in a process of deflecting the electron beam, for example, since in comparison with a condition that an electromagnetic coil is used as the deflector, the off-axis aberration of the magnetic deflection field generated by magnetic deflector may be relatively small; then, in a condition of a same size of field of view, the off-axis resolution of magnetic deflector is higher than that of the electric deflector. However, the magnetic deflector has a disadvantage lying in that, scanning speed of the magnetic deflector is relatively slow due to the existence of the hysteresis phenomenon thereof and thus the magnetic deflector is not suitable for being used in the field of defect detection of patterns of semiconductor silicon wafer by electron beam.

Thereby, by way of example, an electromagnetic lens is typically as an objective lens arranged behind or after an electron beam deflection mechanism; Specifically, in a typical electron beam inspection apparatus, e.g., a scanning electron microscope (SEM), there are two deflectors provided in the electron beam deflection mechanism, i.e., a first deflector which is configured to deflect the electron beam emitted from an electron beam source in an off-axis way, and a second deflector deflects the electron beam back towards a paraxial position, such that the electron beam thus deflected then travels to the objective lens and focuses to image near a pole piece of the objective lens. With the assistance of the deflector, a movement of positioning and scanning the electron beam thus generated on the sample to be detected can be used to generate and acquire secondary electrons or backscattered electrons from the sample, and then used to generate the sample image. The image obtained by such a typical scanning way is subject to a fact that an off-axis aberration of the electron beam incident on the surface of the sample to be detected is relatively large, such that its available field of view is relatively small, which affects the operation efficiency of the electron beam inspection apparatus.

Furthermore, upon consideration that the deflectors are specifically electrostatic deflectors respectively, in view of requirement for improving the field of view size, then size of the field of view size may be improved, by changing shape and size of electric deflectors, each for example being in the form of such as 4-pole deflector, 8-pole deflector, 12 pole deflector, etc. Among others, the 8-pole deflector may be produced by relatively simple processes, but it may be controlled electrically in a relatively complex way; the 12-pole deflector may be controlled electrically in a relatively simple way, but may be produced by relatively complex processes. Or alternatively, in order to improve the size of the field of view, for example, an acquisition of images generated by the electron beam may be implemented, e.g., by an operation mode of partition scanning, which has a relatively high requirement for driving waveform of the electron beam and thus is difficult to design; moreover, such a scanning way may have relatively high requirements for image generator and thus is cumbersome in data processing. In another alternative embodiment, in order to improve the size of the field of view, it may be optional to increase the available field of view by changing the optical axis of the electron beam, and two deflectors provided additionally are used to translate the optical axis of the electron beam; however, the processing and installation processes may be very complex, with an installation error having a significant impact on the aberration of the electron beam.

Therefore, in a relevant technical field, it is required urgently to obtain improved scanning electron microscope device and electron beam inspection apparatus, which can improve off-axis aberration of the electron beam incident thereon, ensure an maximum available field of view of scanning image produced by the electron beam, thus enhancing operational efficiency of the inspection apparatus which may improve the overall resolution of images, reduce the spot size of off-axis electron beam and improve the throughput of electron beam detection apparatus.

SUMMARY

The embodiments of the present disclosure have been made to overcome or alleviate at least one aspect of the above mentioned disadvantages and/or shortcomings in the prior art, by providing a scanning electron microscope device and an electron beam inspection apparatus.

In order to achieve above objectives, following technical solutions are adopted in exemplary embodiments of the invention.

According to one aspect of embodiments of the disclosure, there is provided a scanning electron microscope device for a sample to be detected, which is configured to project electron beam to a surface of the sample to generate backscattered electrons and secondary electrons, comprising: an electron beam source configured to emit along an optical axis thereof the electron beam; a deflection mechanism; and an objective lens assembly. The deflection mechanism, comprises a first deflector located downstream the electron beam source; and a second deflector located downstream the first deflector. The objective lens assembly comprises an excitation coil which is energized to create a magnetic field; and a magnetic yoke formed by a magnetizer material as a housing which opens towards the sample. The magnetic yoke comprises a hollow body defining an internal chamber where the excitation coil is accommodated; and at least one inclined portion extending inward from the hollow body at an angle with reference to the hollow body and directing towards the optical axis, with an end of the at least one inclined portion being formed into a pole piece. The deflection mechanism further comprises a compensation electrode, which is located between the pole piece and the surface of the sample and is configured to adjust a focusing position of the electron beam at which the electron beam is focused, in a condition of excitation thereof with a voltage being applied thereon, by adjusting the voltage.

According to exemplary embodiments of the present disclosure, a magnitude of the voltage changes in real time with a change in a scanning position over which the electron beam scans, such that the electron beam is focused by a respective portion of the electric field through which a portion of the electron beam deviating from the optical axis passes, into a condition that the electron beam is in a constant in-focus condition across the surface of the sample.

According to exemplary embodiments of the present disclosure, the voltage floats at a higher voltage than that at the surface of the sample.

According to exemplary embodiments of the present disclosure, the compensation electrode is in a form of a closed shape which is centrally hollowed and centrally symmetric with respect to the optical axis.

According to exemplary embodiments of the present disclosure, the compensation electrode is in a form of a planar ring shape According to exemplary embodiments of the present disclosure, the compensation electrode is in a form of a curved surface profile which is centrally hollowed, with a surface thereof which is more proximate to the pole piece being constructed as a cambered surface having a uniform radius.

According to exemplary embodiments of the present disclosure, an intersection point of the cambered surface intersecting with the optical axis is located at the surface of the sample.

According to exemplary embodiments of the present disclosure, the scanning electron microscope device further comprises a third deflector located between the second deflector and the objective lens assembly and disposed in an opening delimited and circumscribed by the pole piece, and each of the first deflector, the second deflector and the third deflector is an electrostatic deflector.

According to exemplary embodiments of the present disclosure, each of the first deflector and the second deflector comprises a pair of electrodes provided opposite to each other and symmetrically relative to the optical axis, and is applied with respective electric excitation which is adjustable so as to adjust both direction and angle of the electron beam passing through the scanning electron microscope device.

According to exemplary embodiments of the present disclosure, each of the first deflector and the second deflector is in the form of 8-pole or 12-pole electrostatic deflector, and is applied with respective electric excitation which is adjustable so as to adjust both direction and angle of the electron beam passing through the scanning electron microscope device.

According to exemplary embodiments of the present disclosure, each of the first deflector, the second deflector and the third deflector comprises a pair of electrodes provided opposite to each other and symmetrically relative to the optical axis, and is applied with respective electric excitation which is adjustable so as to adjust both direction and angle of the electron beam passing through the scanning electron microscope device.

According to exemplary embodiments of the present disclosure, each of the first deflector, the second deflector and the third deflector is in the form of 8-pole or 12-pole electrostatic deflector, and is applied with respective electric excitation which is adjustable so as to adjust both direction and angle of the electron beam passing through the scanning electron microscope device.

According to exemplary embodiments of the present disclosure, the pole piece is an end of the inclined portion of the magnetic yoke substantially disposed parallel to the optical axis, and a length of each electrode of the third deflector is of the same order of magnitude as a thickness of the pole piece but is not smaller than and is preferably equal to the thickness of the pole piece.

According to exemplary embodiments of the present disclosure, the first deflector, the second deflector and the third deflector are arranged coaxially with each other or one another along the optical axis.

According to exemplary embodiments of the present disclosure, electrodes of the third deflector are arranged at a predetermined angle relative to electrodes of the first deflector, and the predetermined angle is set such that an off-axis aberration of the electron beam which is subject to deflection applied by the third deflector is minimized.

According to exemplary embodiments of the present disclosure, the third deflector is formed by a non-magnetizer material which is electrically conductive.

According to exemplary embodiments of the present disclosure, the inclined portion of the objective lens assembly defines an electron beam channel shrinking towards the sample, with a portion of the electron beam channel at the third deflector being a gap defined between the electrodes of the third deflector in a diameter direction thereof.

According to another aspect of embodiments of the disclosure, there is provided an electron beam inspection apparatus, comprising: the scanning electron microscope device as above; a first detector located downstream the sample and configured to detect backscattered electrons generated by the electron beam incident on the surface of the sample; and a second detector located downstream of the sample and configured to detect secondary electrons generated by the electron beam incident on the surface of the sample.

BRIEF DESCRIPTION OF THE DRAWINGS

Embodiments of the present disclosure will now be described, merely by way of example, with reference to the accompanying schematic drawings, in which the corresponding reference numerals represent the corresponding components. A brief description of the drawings is as follows.

DETAILED DESCRIPTION OF EMBODIMENTS

Figure 1:
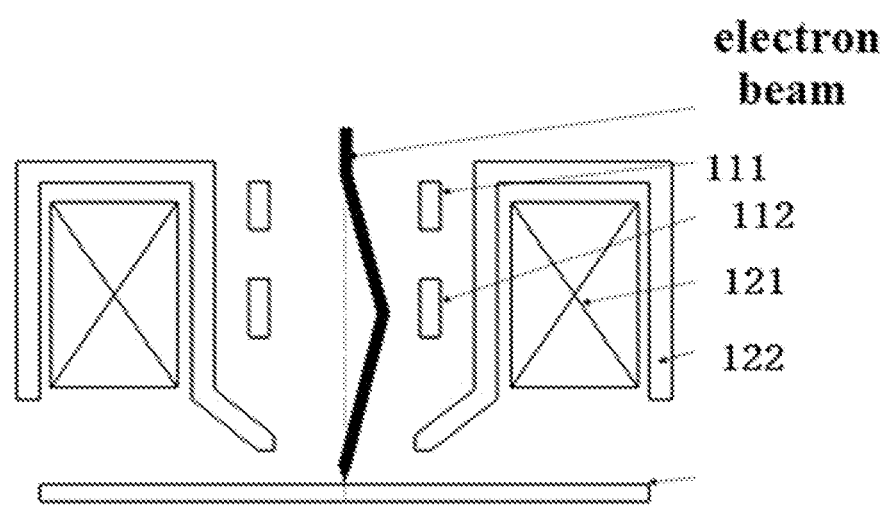
FIG. 1 is a schematic structural view illustrating a scanning electron microscope device in relevant art.

Technical solution of the present disclosure will be further explained in detail through the embodiments in combination with the accompanying drawings. In the specification, same or similar reference numerals and alphabets indicate same or similar components. Following description of the embodiments of the present disclosure with reference to the accompanying drawings is intended to explain overall inventive concept of the present disclosure, rather than a limitation of the present disclosure.

The accompanying drawings are used to illustrate the contents of embodiments of the present disclosure. Dimensions and shapes of the components in the drawings do not demonstrate true scales of components of a scanning electron microscope device and an electron beam inspection apparatus.

In embodiments of the present disclosure, expression "downstream" refers to a direction in or along a travel direction of the electron beam emitted from an electron source, and expression "upstream" refers to a direction opposite to the travel direction of the electron beam emitted from the electron source.

Moreover, in embodiments of the present disclosure, expressions "radial direction", "diameter direction" and "axial direction" all take a direction of an optical axis O of an electron beam source 10 as a reference.

FIG. 1 is a schematic structural view illustrating a scanning electron microscope device 1 in relevant art.

By way of example, as shown in FIG. 1, an operation mode of a deflector of a scanning electron microscope device 1 in relevant art is depicted. A first deflector 111 and a second deflector 112 deflect an electron beam sequentially and in succession, at respective angles, respectively. For example, it is illustrated that, the first deflector 111 deflects the electron beam outward and deviating from an optical axis in an initial state thereof (e.g., an optical axis of an electron beam source emitting the electron beam), and then the second deflector 112 deflects back the electron beam, which has been deflected outward by the first deflector 111, towards the optical axis, that is, the electron beam is deflected reversely by an action of the second deflector 112 as compared with a deflection of the electron beam at the first deflector 111 so as to advance towards an proximity of the optical axis and in turn to implement imaging by finally focusing at an objective lens assembly (more specifically, e.g., in a proximity of a pole piece of the objective lens assembly). An image obtained by such a scanning way will be subject to a relatively large off-axis aberration of the electron beam, resulting in a relatively restricted available field of view (FOV).

Figure 2A:
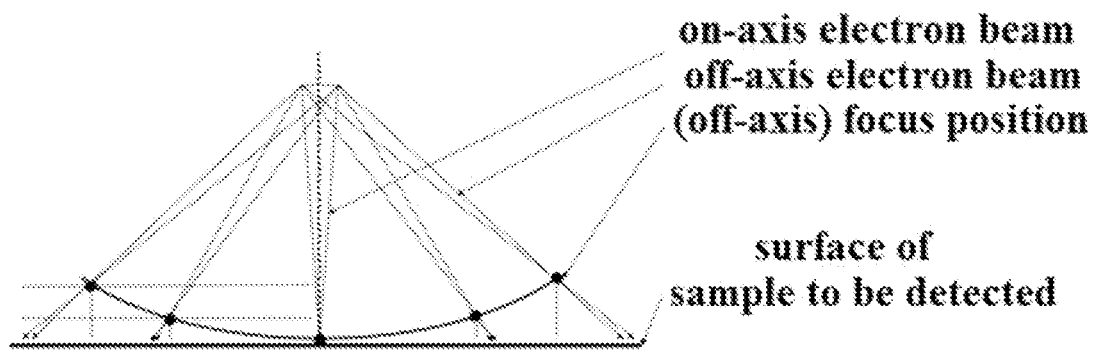
FIG. 2A is a schematic view showing a focusing effect of the electron beam applied by a magnetic field generated by the scanning electron microscope device in the relevant art as illustrated in FIG. 1 in an operation condition.
Figure 2B:
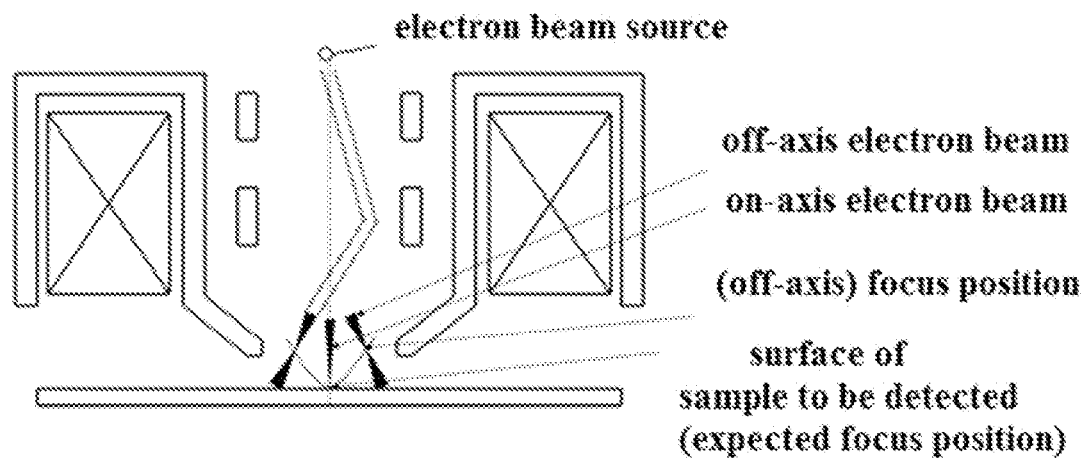
FIG. 2B illustrates a schematic path in which an electron beam of the scanning electron microscope device in the relevant art as shown in FIG. 1, which is in the operation condition, is deflected by deflectors and focused by an objective lens assembly.

FIG. 2A is a schematic view showing a focusing effect of the electron beam applied by a magnetic field generated by the scanning electron microscope device in the relevant art as illustrated in FIG. 1 in an operation condition; and FIG. 2B illustrates a schematic path in which an electron beam of the scanning electron microscope device in the relevant art as shown in FIG. 1, which is in the operation condition, is deflected by deflectors and focused by an objective lens assembly.

As illustrated in FIG. 2A, when the scanning electron microscope device in the relevant art as illustrated in FIG. 1 scans and images under normal circumstances, the electron beam is being focused under an action of a magnetic field of the objective lens assembly, with an on-axis electron beam (i.e., an on-axis portion of the electron beam) being in focus on a surface of a sample to be detected, that is, an on-axis beam spot generated by the on-axis electron beam on the surface of the sample is minimized. Based on an arrangement of an excitation coil of the scanning electron microscope device as illustrated in FIG. 1, the closer the magnetic field generated by the excitation coil is to a body of the coil, the stronger the focusing capacity on the electron beam by the magnetic field is (on the contrary, the farther the magnetic field is to the body of the coil, i.e., the closer the magnetic field is to the optical axis, the weaker the focusing capacity on the electron beam by the magnetic field is, gradually); in other words, the coil is located off the axis and thus an electromagnet formed thereby is also located off the axis (and they are arranged to be symmetrical about the optical axis in a circumferential direction, for example, as illustrated), therefore, an off-axis magnetic field has relatively stronger focusing capacity than that of an on-axis magnetic field, resulting in that an off-axis electron beam (i.e. off-axis portion of the electron beam, also referred to as off-axis electron beam) as illustrated in FIG. 2b has been focused before reaching the surface of the sample to be detected, thereby the off-axis electron beam has been in an overfocus condition upon being incident on the surface of the sample to be detected. As such, an actual focal plane defined by many actual focal points of the electron beam is illustrated in FIG. 2A, for example, essentially in a form of a virtual curved surface which projects towards a position of the on-axis beam spot formed on the surface of the sample to be detected. Thus, based on the scanning electron microscope device in the relevant art as illustrated in FIG. 1, the off-axis electron beam thus obtained has been essentially in an overfocus condition upon being incident on the surface of the sample to be detected, resulting in an enlarged size of the beam spot thus obtained and a decreased size of maximum available field of view.

Figure 3A:
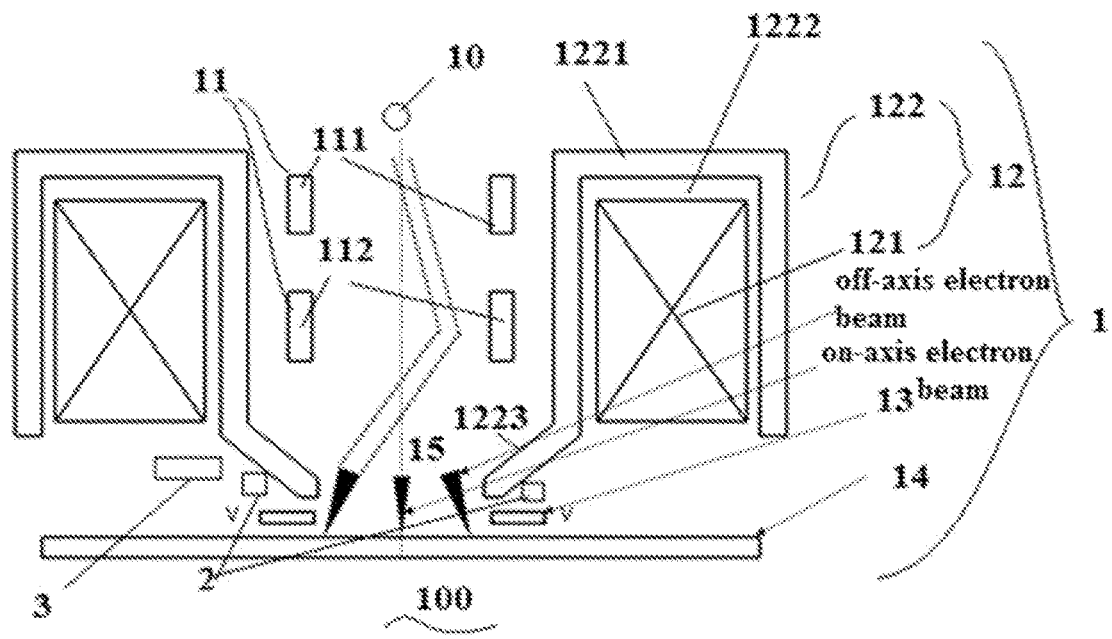
FIG. 3A is a schematic structural view illustrating a scanning electron microscope device according to embodiments of the present disclosure and an exemplary electron beam inspection apparatus comprising the scanning electron microscope device.

FIG. 3A is a schematic structural view illustrating a scanning electron microscope device 1 according to embodiments of the present disclosure and an exemplary electron beam inspection apparatus 100 comprising the scanning electron microscope device 1.

According to a general technical concept of the present disclosure, as illustrated in FIG. 3A, in a first aspect of embodiments of the present disclosure, there is provided a scanning electron microscope device 1 for a sample 14 to be detected, which is configured to project electron beam to a surface of the sample 14 to generate backscattered electrons and secondary electrons for detection on properties of the sample 14, the scanning electron microscope device 1 at least comprising an electron beam source 10, a deflection mechanism 11 for the electron beam located downstream the electron beam source 10, and an objective lens assembly 12 located downstream the deflection mechanism 11. By way of example, the electron beam source 10 is configured to emit an electron beam along an optical axis O of the electron beam source 10. In exemplary embodiments, specifically, the electron beam source 10 is, for example, a hot electron emitter, a cold field emitter, or a hot electron field emitter (e.g., a Schottky emitter). The electron beam source 10 comprises, for example, a single emitter or a plurality of emitters of any one type of above types of electron emitters. For example, the deflection mechanism 11 comprises at least: a first deflector 111 located downstream the electron beam source 10; and a second deflector 112 located downstream the first deflector 111. And, by way of example, the objective lens assembly 12 comprises an excitation coil 121 which is energized to create a magnetic field and a magnetic yoke 122 which is for example a housing formed by a magnetizer material to open towards the sample 14. And the magnetic yoke 122 further comprises: a hollow body 1221 which is for example in the form of closed ring shape and defines an internal chamber 1222; and at least one inclined portion 1223 which extends (e.g., at whole circumference thereof) inward from the hollow body 1221 (e.g., at an angle with reference to the hollow body) and directing towards the optical axis O. For example, as illustrated, the at least one inclined portion 1223 comprises an inclined portion 1223 extending inward toward the optical axis O from a radial inner wall of the hollow body 1221 at an angle (and in turn, for example, at an angle with reference to the optical axis O), with an end of the at least one inclined portion (e.g., the inclined portion 1223) being formed as a pole piece 1224, the excitation coil 121 being accommodated in the internal chamber 1222. As such, the pole piece 1224 opens in a direction essentially directing towards the sample 14 to be detected.

By way of example, the magnetizer material forming the magnetic yoke 122 is, for example, a soft magnetic material, e.g., a ferromagnetic material, preferably iron, ferroalloy, or any other relatively material having relatively high magnetic permeability and thus used to provide a magnetic path of relatively low magnetic reluctance for the magnetic field established by the excitation coil. As such, magnetic field lines between opposite portions of the pole piece 1224 (i.e., portions of the pole piece 1224 arranged opposite to each other, e.g., diametrically opposite to each other) result in a completed magnetic circuit; and since the pole piece 1224 opens in a direction essentially directing towards the sample 14 to be detected, then the sample 14 to be detected is considered to be immersed in the magnetic field of the magnetic lens thus formed. In other words, the objective lens assembly 12 is essentially an immersed type magnetic lens excited by a current coil; for example, metal wire can be wound into an excitation coil thereof (i.e., the current coil), and the magnetic yoke 122 functioning as the housing which is formed for example by ferromagnetic material is located outside the excitation coil, and the pole piece 1224 of the magnetic lens is located at the opening of the magnetic yoke 122 (i.e., the housing), such that the sample 14 to be detected (for example, the surface thereof), is immersed in the magnetic field of the magnetic lens.

Moreover, in embodiments of the present disclosure, as shown in FIG. 3A, for example, the deflection mechanism 11 further comprises a compensation electrode 13 for example formed by metallic material, which is located between the pole piece 1224 and the surface of the sample 14 and is configured to adjust a focusing position of the electron beam at which the electron beam is focused, in a condition of excitation thereof with a voltage being applied thereon, by adjusting the voltage. Specifically, by way of example, based on the scanning electron microscope device as illustrated in the relevant art as illustrated in FIG. 1, an electrode is additionally provided between the pole piece 1224 of the objective lens assembly 12 and the surface of the sample 14 to be detected so as to act as the compensation electrode 13, with a voltage applied to the compensation electrode 13 being variable; further, a magnitude of the voltage changes in real time with a change in a scanning position over which the electron beam scans, specifically for example a dynamic compensation is implemented on the magnitude of the voltage as the scanning position varies, thereby changing the electric field (of the compensation electrode) through which the off-axis electron beam travels, such that the electron beam can be focused just on the surface of the sample 14 to be detected, into an in-focus condition thereon. As such, the size of off-axis beam spot may be effectively reduced to improve the maximum available field of view.

By way of example, the compensation electrode is formed by a metallic material, e.g., an alloy material, more specifically, such as an iron nickel alloy or a gold-plated aluminum plate, wherein the iron nickel alloy has magnetoconductivity or magnetic permeability, i.e., magnetizer property, which will affect the magnetic field of the magnetic lens; while the gold-plated aluminum plate is an electrically conductive material having relatively low magnetoconductivity or magnetic permeability and thus functions to shield (i.e., weaken) the deceleration electric field due to its electroconductivity or electrical conductivity, while functions to merely have limited effect of magnetic bypass due to its relatively low magnetoconductivity or magnetic permeability, and thus it is more conducive to the treatment of stray electrons.

In a specific embodiment, as illustrated in FIG. 3A, when the electron beam is deflected off the axis for imaging, then, a location of focus at which the electron beam is focused may be moved back by a certain distance by changing the voltage of the compensation electrode 13. When an appropriate voltage value is selected, an optimal location of focus just falls on the surface of the sample 14 to be detected so as to implement the compensation for overfocus condition. In case that the electron beam is deflected to different positions, then the voltage applied on the compensation electrode 13 may vary accordingly, that is, the voltage may change in real time, such that the electron beam is focused by a respective portion of the electric field through which a portion of the electron beam deviating from the optical axis O passes, into a condition that the electron beam is always in focus across the surface of the sample 14 to be detected, so as to implement a real-time dynamic compensation for overfocus condition. More specifically, the farther the electron beam is from the optical axis O, the greater the voltage applied to the compensation electrode 13 is; therefore, the voltage applied to the compensation electrode is referred to as dynamic compensation voltage.

According to an embodiment of the present disclosure, for example, as compared with a voltage at the surface of the sample 14 (for example, which is referred to as Vo), the voltage applied to the compensation electrode 13 floats at a higher voltage V, which is a positive voltage relative to the voltage at the surface of the sample 14 to be detected. At this time, the compensation electrode 13 achieves dynamic compensation for the electron beam; and at the same time, the scattered secondary electrons from the sample 14 is also accelerated in a reverse direction by the compensation electrode 13, relative to the incident direction thereof onto the sample, such that more secondary electrons may impinge on the detector per unit time, improving a collection rate of the secondary electrons and enhancing a signal-to-noise ratio of the image of the secondary electrons.

Here, an electric field may be generated between the compensation electrode 13 and the surface of the sample 14 to be detected, which, for example, acts as a deceleration field or a retardation field, which is also referred to as a deceleration electrostatic field. Thus, the deceleration electrostatic field and the magnetic field generated by the objective lens assembly 12 (e.g., an immersed type magnetic field, or alternatively a semi-immersed type magnetic field, as defined hereinafter) co-operatively form (i.e., are synthesized into) a composite immersion deceleration absorption lens field (i.e., a composite lens field, which is of an immersion type where the surface of the sample to be detected is immersed and is configured to absorb the energy of the electron beam), whose function mainly comprises three aspects as follows. In a first aspect, the composite immersion deceleration absorption lens field is capable of focusing the electron beam incident on the sample 14 to be detected, i.e., to focus the electron beam on the surface of the sample 14 to be detected, so as to ensure that portions of the electron beam incident on the surface of the sample 14 to be detected all maintain in an in-focus condition there. In a second aspect, the composite immersion deceleration absorption lens field is capable of decelerating the electron beam incident on the sample to be detected 14. Specifically, by adjusting power supply, the compensation electrode 13 and the sample 14 to be detected then jointly and co-operatively define a deceleration device, which is capable of reducing the energy of the electron beam, which functions as a primary electron beam incident onto the surface of the sample 14, to a landing energy of the primary electron beam as required, so as to ensure that the primary electron beam successfully falls onto the surface of the sample 14 to be detected at a relatively lower energy than a landing energy as required in the relevant art, reducing for example a charge effect of non-conductive sample and the like, and also decreasing an impact of the primary electrons of the electron beam landing and impinging on the surface of the sample 14 to be detected. In a third aspect, signal electrons generated on the surface of the sample 14 to be detected (i.e., electrons which are generated after the electron beam impinging on the surface of the sample 14, and carry information, comprising backscattered electrons and secondary electrons) are accelerated, so as to improve the collection efficiency of the respective detectors for these backscattered electrons and secondary electrons, and to improve the throughput of detection of secondary electrons.

Moreover, since the primary electrons of the electron beam that may be generated and formed by the electron microscope system may merely decelerate to desired kinetic energy immediately above and adjacent to the surface of the sample 14 to be detected, then the arrangement structure as above allows acquisition of favorable optical characteristics of the electron microscope system with the arrangement structure of the objective lens assembly 12 as above, for example.

In the embodiment of the present disclosure, for example, the compensation electrode 13 is in a form of a closed shape which is centrally hollowed and centrally symmetric with respect to the optical axis O, such as a central orifice plate or a ring having central opening (for facilitating passing the electron beam therethrough). In a more specific embodiment, for example, the compensation electrode 13 is in a form of a planar ring shape (having a uniform inner diameter of a hole circumscribed by the ring shape). In an alternative more specific embodiment, for example, the compensation electrode 13 is in a form of a curved surface profile which is centrally hollowed (such as a bowl shape which projects towards the surface of the sample 14 to be detected, and the like), with a surface thereof which is more proximate to the pole piece 1224 being constructed as a cambered surface (i.e., a circular arc surface) having a uniform radius. For example, more specifically, a curvature of the cambered surface is set to be similar to or substantially the same as a curvature of a virtual curved surface as illustrated in FIG. 2A, which is defined in a scanning electron microscope device of the prior art in the absence of the compensation electrode 13 by actual focus points of the electron beam and thus shaped to project towards a location of on-axis beam spot on the surface of the sample 14 to be detected. Moreover, by way of example, an intersection point between the cambered surface and the optical axis O is located at the surface of the sample 14 to be detected, that is, a landing position of on-axis electron beam.

In the embodiment of the present disclosure, for example, as shown in FIG. 3A, each of the first deflector 111 and the second deflector 112 comprises a pair of electrodes provided opposite to each other and symmetrically relative to the optical axis O, and is applied with respective electric excitation which is adjustable so as to adjust both direction and angle of the electron beam passing through the scanning electron microscope device Moreover, in the embodiment of the present disclosure, for example, as shown in FIG. 3A, each of the first deflector 111 and the second deflector 112 is in the form of 8-pole or 12-pole electrostatic deflector, and is applied with respective electric excitation which is adjustable so as to adjust both direction and angle of the electron beam passing through the scanning electron microscope device.

Based on above embodiments, other embodiments having variations and modifications may be implemented.

Figure 3B:
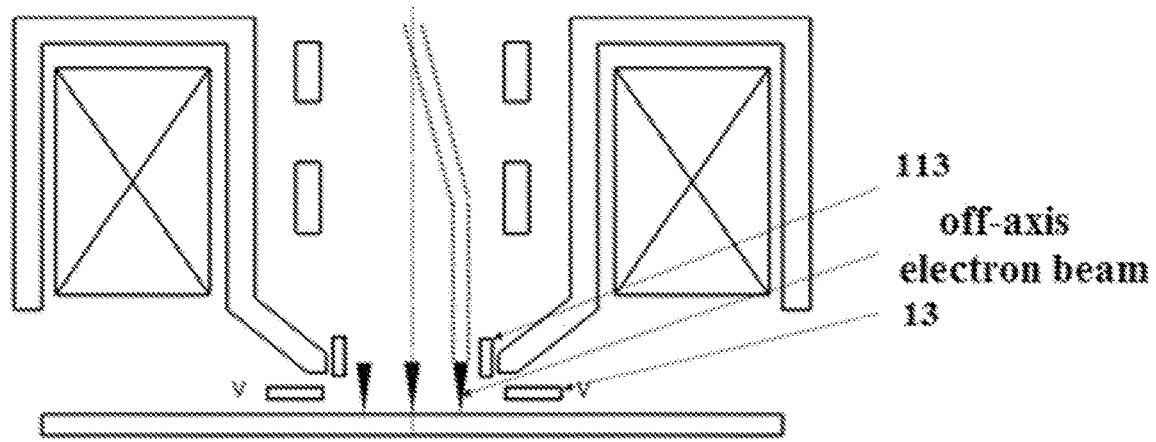
FIG. 3B is a schematic structural view illustrating a scanning electron microscope device constructed on a basis of FIG. 3A, according to another embodiment of the present disclosure, which is provided with an additional third deflector.

FIG. 3B is a schematic structural view illustrating a scanning electron microscope device constructed on a basis of FIG. 3A, according to another embodiment of the present disclosure, which is provided with an additional third deflector.

In another embodiment of the present disclosure, as illustrated in FIG. 3B, as an extended embodiment based on the embodiments of the present disclosure on the basis of FIGS. 3A, there is provided a scanning electron microscope device 1, which further comprises, in addition to the above settings, for example, a third deflector 113 located between the second deflector 112 and the objective lens assembly 12 and disposed in an opening delimited and circumscribed by the pole piece 1224. By way of example, each of the first deflector 111, the second deflector 112 and the third deflector 113 is an electrostatic deflector.

FIG. 3B illustrates a schematic trajectory of electron beam of the scanning electron microscope as illustrated in FIG. 3A. According to embodiments of the present disclosure, a solution as illustrated in FIG. 3 may further enhance maximum available field of view, and is specifically constructed by combining a dynamic focusing effect of the compensation electrode 13 with an effect of the third deflector 113.

With above settings, for example, as illustrated in FIG. 3B, fine and dense dotted line illustrate a travelling path of the electron beam in a condition of merely two deflectors without a third deflector 113, and sparse dotted line having thick spacing among dots illustrate another travelling path of the electron beam in a condition of three deflectors (i.e., having the third deflector 113 in addition to the first deflector and the second deflector). A propagation direction of the electron beam in which the electron beam propagates/travels from the electron beam source 10 is deflected after the electron beam passes through the first deflector 111; And then, after the electron beam further passes through the second deflector 112, the propagation direction of the electron beam is further subject to a reverse deflection back towards the optical axis O, as compared with the deflection effect of the first deflector; and next, the electron beam passes through a synthetic/combined electromagnetic field formed by both the objective lens and the third deflector 113, and finally the electron beam is focused on the surface of the sample.

With above settings, in the deflection mechanism 11 in embodiments of the present disclosure, three electrostatic deflectors are adopted respectively, wherein the first deflector 111 is used to deviate the propagation direction of the electron beam away from the optical axis O, and the second deflector 112 further deflects the propagation direction of the electron beam reversely. A purpose of providing the two deflectors is to change the propagation direction of the electron beam in which it travels. Moreover, by way of example, the third deflector 113 is installed at center(s) of magnetic field and/or electric field of the objective lens assembly 12, and an off-axis aberration of off-axis electron beam is reduced with a distribution of electrostatic field, so as to improve size of an available field of view (FOV). A solution of embodiments of the present disclosure is mainly directed towards a technical field of semiconductor defect detection with electron beam.

By way of example, the first deflector 111, the second deflector 112 and the third deflector 113 are arranged coaxially with each other or one another along the optical axis O.

Moreover, in embodiments of the present disclosure, each of the first deflector 111, the second deflector 112 and the third deflector 113 of the deflection mechanism 11 comprises at least a pair of electrodes provided opposite to each other and symmetrically relative to the optical axis O, and is applied with respective electric excitation which is adjustable so as to adjust both direction and angle of the electron beam passing through the scanning electron microscope device.

More specifically, voltage excitations among the third deflector 113, and the first deflector 111 and the second deflector 112 may be proportional. If different voltage ratios are adopted, then resolutions of scanning images of the electron beam may vary (i.e., resolutions of scanning images are different). Magnitudes of respective electric excitations of the three deflectors are adjusted depending on different acceleration energies as required respectively, so as to ensure a maximum available field of view of the image generated by the electron beam.

In a more specific embodiment, by way of example, each of the first deflector 111, the second deflector 112 and the third deflector 113 comprises a pair of electrodes provided opposite to each other and symmetrically relative to the optical axis O, and is applied with respective electric excitation which is adjustable so as to adjust both direction and angle of the electron beam passing through the scanning electron microscope device.

In an alternative more specific embodiment, for example, each of the first deflector 111, the second deflector 112 and the third deflector 113 is a multi-pole type electrostatic deflector for example comprising four, six, eight, ten, twelve or any even number of poles. Each multi-pole type electrostatic deflector may be "excited" with different voltages or currents to control a parameter referred to as "excitation intensity". The excitation intensity represents a capacity of extending or restraining a cross section of the electron beam (such cross section may be referred to as "beam spot"). In the present disclosure, "excitation" refers to a process of generating deflection fields by applying voltages respectively. Typically, the multi-pole type electrostatic deflector is for example in the form of 8-pole or 12-pole electrostatic deflector, and is applied with respective electric excitation which is adjustable so as to adjust both direction and angle of the electron beam passing through the scanning electron microscope device. Specifically, an electrostatic deflector in the form of either 8-pole or 12-pole electrostatic deflector may be used to reduce the off-axis aberration of the electron beam, with a difference therebetween lying in that: 8-pole electrostatic deflector requires a relatively complex electronic control module, but it is relatively easy to process and to ensure the processing accuracy therefore; while an electric control module of 12-pole electrostatic deflector is relatively simple, but the processing thereof is relatively cumbersome and thus is not easy to ensure the accuracy.

Both direction and angle of the electron beam are adjustable upon passing through the three deflectors, by changing magnitudes of respective excitations of the three deflectors. The electron beam passing through the second deflector 112 may enter the third deflector 113 in a direction parallel to the optical axis O, or may enter the third deflector 113 at a small angle (e.g., less than 30 degree angle, preferably less than 10 degree angle) relative to the optical axis O, as illustrated in FIG. 3B.

With the arrangement as illustrated FIG. 1, when the off-axis electron beam continues to pass through the magnetic field of the objective lens assembly 12 after passing through the first two deflectors (i.e., the first deflector and the second deflector), the off-axis electron beam will produce aberration and reduce the resolution of the off-axis electron beam, thereby affecting the maximum available field of view. Furthermore, based on a further setting of FIG. 3B, in the embodiment of the present disclosure, the third deflector 113 is additionally provided in the proximity of the pole piece 1224 of the objective lens assembly 12 so as to correct the off-axis aberration when the off-axis electron beam passes through the magnetic field of the objective lens assembly 12, especially by significantly reducing off-axis chromatic aberration, field curvature and distortion (especially the latter two, i.e., field curvature and distortion) of the electron beam, thereby ensuring that the beam spot size of the electron beam may not be excessively large. Since the magnetic field of the objective lens has both an on-axis focusing capacity and an off-axis focusing capacity which is stronger than the on-axis focusing capacity, resulting in that an optimal off-axis focus point fails to fall on the surface of the sample 14 to be detected, which also affects the maximum available field of view. Thereby, for example, as illustrated in FIG. 3B, in embodiment of the present disclosure, the compensation electrode 13 is further disposed between the objective lens assembly 12 and the surface of the sample 14 to be detected, and the off-axis electron beam is further focused on the surface of the sample by changing the voltage applied on the compensation electrode 13, such that the beam spot size of the off-axis electron beam is further reduced so as to further improve the maximum available field of view of the scanning image.

Table 1 is a list of comparisons of imaging effects of the electron beam between the scanning electron microscope device 1 of different embodiments of the present disclosure as illustrated in FIG. 3A and FIG. 3B and the scanning electron microscope device 1 in relevant art as illustrated in FIG. 1.

TABLE 1

|  | on-axis beam spot (nm) | 100 um FOV beam spot (nm) | 200 um FOV beam spot (nm) |
| --- | --- | --- | --- |
| dual deflectors | 6.43 | 16.73 | 63.2 |
| triple deflectors | 6.05 | 9.5 | 34.56 |
| magnetic dynamic focusing | 4.78 | 9.27 | 28.488 |
| electric dynamic focusing | 4.79 | 9.415 | 27.75 |
| triple deflectors & dynamic focusing | 4.84 | 6.072 | 13.22 |

With above settings, as compared with the scanning electron microscope device 1 in relevant art as illustrated in FIG. 1, in the scanning electron microscope of embodiments of the present disclosure as illustrated in FIG. 3B, a comparison of the size of the off-axis beam spot in different conditions is illustrated, from which it can be seen that the aberration of the off-axis electron beam will be significantly reduced, by additionally providing both the third deflector 113 and the compensation electrode 13 that carries out the dynamic compensation on focusing for achieving the constant in-focus condition of the electron beam at the surface of the sample 14 to be detected. For example, in a condition of a field of view having a size of 100 μm, the size of the off-axis beam spot with the device as illustrated in FIG. 3B is reduced by 63.7% as compared with that with the prior art device; or otherwise in a condition of a field of view having a size of 200 μm, the size of the off-axis beam spot with the device as illustrated in FIG. 3B is reduced by 79% as compared with that with the prior art device. As such, an overall resolution of the image is enhanced, thereby significantly improving the maximum available field of view of the scanning image.

It should be noted that, an application scenario of 'magnetic dynamic focusing' is illustrated in Table 1, referring to a dynamic focusing applied on the electron beam with the magnetic field generated in a condition that the electromagnet is energized electrically (i.e., by changing an excitation current in real time, which flows through the excitation coil and is in turn excites the electromagnet). And another application scenario of 'electric dynamic focusing' is disclosed in embodiments of the disclosure, referring to a dynamic focusing applied on the electron beam with the electric field generated by the compensation electrode. And as compared with the magnetic dynamic focusing, the electric dynamic focusing has an advantage thereover, lying in that, with the electric dynamic focusing, it does not need to occupy a large amount of space as additional coil space for accommodating additional coil.

Therefore, an incident angle of the electron beam entering the objective lens assembly 12 may be controlled by changing the deflection excitation of the second deflector 112, and then, the maximum available field of view of the electron beam image may be ensured, by changing the excitation of the third deflector 113, which fact expands service conditions of the deflector.

In exemplary embodiments of the present disclosure, specifically, for example, the hollow body 1221 is an annular hollow body 1221 defining the internal chamber 1222 in a form of annular shape for accommodating the excitation coil 121 therein.

And, as illustrated in FIG. 3A, specifically, for example, the inclined portion 1223 is in a form of a conical ring shrinking towards the sample.

In exemplary embodiments of the present disclosure, for example, the inclined portion 1223 of the objective lens assembly 12 defines an electron beam channel 15 shrinking towards the sample 14, with a portion of the electron beam channel 15 at the third deflector 113 being a gap defined between the electrodes of the third deflector 113 in a diameter direction thereof.

Moreover, installation position, size and installation angle of the third deflector 113 additionally provided in the opening of the pole piece 1224 of the objective lens assembly 12 have great influence on the off-axis aberration of the electron beam propagating therethrough; the material of the third deflector 113 may also affect electromagnetic properties of the electron beam. Therefore, it is necessary to properly set the material, specific installation settings (comprising installation position, installation orientation, angle, and the like) and size of the third deflector 113.

In exemplary embodiments of the present disclosure, as illustrated in FIG. 3A, for example, the pole piece 1224 is an end of the inclined portion 1223 of the magnetic yoke 122 disposed substantially parallel to the optical axis O, and a length of each electrode of the third deflector 113 is of the same order of magnitude as a thickness of the pole piece 1224 but is not smaller than and is preferably equal to the thickness of the pole piece 1224. Thereby, the selection of both size of the third deflector 113 (e.g., especially a length thereof along an extension direction in which its electrode extends) and size of the pole piece 1224 (especially the thickness thereof) is essentially computationally obtained by conversion, for a combination of both size of the third deflector 113 and size of the pole piece 1224 which obtains minimized (or approximately minimized) off-axis aberration on the basis of results of a simulation analysis with the electronic optical simulation software MeBS.

Additionally or alternatively, in other exemplary embodiments of the present disclosure, for example, the orientation of electrodes of the third deflector 113 is arranged at a predetermined angle relative to electrodes of the first deflector 111, and the predetermined angle is set such that an off-axis aberration of the electron beam which is subject to deflection applied by the third deflector 113 is minimized. This predetermined angle has an important influence on the imaging effect. Thereby, the selection of the orientation (i.e. predetermined angle) of electrodes of the third deflector 113 relative to electrodes of the first deflector 111 is essentially computationally obtained by conversion, for relative angle setting between the third deflector 113 and the first deflector 111 of the third deflector 113 and size of the pole piece 1224 which obtains minimized (or approximately minimized) off-axis aberration on the basis of results of a simulation analysis with the electronic optical simulation software MeBS.

In embodiments of the present disclosure, for example, it is an option that the third deflector 113 is installed inside the pole piece 1224 of the objective lens assembly, and the third deflector 113 is formed by a non-magnetizer material which is electrically conductive. This does not affect a distribution of the magnetic field of the objective lens assembly 12.

FIG. 3B is also a schematic structural view illustrating an exemplary electron beam inspection apparatus 100 comprising the scanning electron microscope device 1 according to embodiments of the present disclosure.

According to the general technical concept of the present disclosure, as illustrated in FIGS. 3A and 3B, in a second aspect of embodiments of the present disclosure, an electron beam inspection apparatus 100 is provided, comprising: the scanning electron microscope device 1 according to the above embodiment (having the compensation electrode 13; alternatively or additionally, being provided with the third deflector 113); a first detector 2 located downstream the sample 14 (for example, between the objective lens assembly 12 and the sample 14 to be detected) and configured to detect backscattered electrons generated by the electron beam incident on the surface of the sample 14; and a second detector 3 located downstream of the sample 14 and configured to detect secondary electrons generated by the electron beam incident on the surface of the sample 14.

By way of example, the first detector 2 operates as a backscattered electron detector, which is for example symmetrically provided on the pole piece 1224 of the magnetic lens of the objective lens assembly 12, on two opposite sides of the electron beam channel 15, and configured to collect the backscattered electron signal generated by an interaction between focused electron beam and the sample 14 to be detected.

In embodiments of the present disclosure, for example, the electron beam inspection apparatus 100 further comprises: a displacement platform module, comprising the following components overlapped with each other or one another: a horizontal displacement platform; a z-direction displacement platform; an electrostatic suction chuck arranged above the z-direction displacement platform and configured to adsorb and hold at an upper surface thereof the sample 14 to be measured; and a position sensing device for sensing the both horizontal and vertical positions of the displacement platform module.

By way of example, the second detector 3 operates as a secondary electron detector, which is for example fixed between the displacement platform module and the pole piece 1224 of the magnetic lens of the objective lens assembly 12, with a grid at a front end of the second detector 3 being applied with a positive bias, thereby it is configured to collect secondary electron signal generated by an interaction between the electron beam and the sample 14 to be detected.

Moreover, in an exemplary embodiment of the present disclosure, for example, in the presence of the compensation electrode 13 as above, the first detector and/or the second detector may define a composite detection assembly located below the magnetic lens, with different voltages being applied respectively on the composite detection assembly, the compensation electrode 13 and the sample 14 to be detected. As such, a decelerating electrostatic lens may be formed thereby, which also generates a decelerating electric field, and the electric field coinciding, to a certain extent (i.e., at least partially), with the magnetic field of the immersed type magnetic lens, such that a composite focusing effect of both the decelerating electric field and the magnetic field will further reduce the aberration of the objective lens assembly 12 and obtain a smaller aberration, as compared with that generated in a condition of purely the immersed type magnetic lens. In other words, with individual control (i.e., discrete control) of respective potentials of the composite detection assembly, the compensation electrode 13 and the sample 14 to be detected, all of the three jointly and cooperatively define one decelerating electric field of the decelerating electrostatic lens, and then the decelerating electric field cooperates with an immersed type magnetic field generated by the magnetic lens jointly form a composite objective field which is of immersed type for deceleration, which may produce at least three composite effects as follows: firstly, it is capable of focusing the electron beam incident on the sample 14; secondly, it is capable of decelerating the electron beam incident on the sample 14 and reducing the energy of the electron beam so as to reduce its impact on the sample; thirdly, it is capable of accelerating signal electrons (comprising backscattered electrons (BSE) and secondary electrons (SE)) generated on the surface of sample 14 so as to improve collection rate of the signal electrons at the detector(s), and in turn to obtain smaller focused beam spots and to achieve higher resolution.

Moreover, in a further embodiment of the present disclosure, for example, an additional deflection control mechanism is additionally provided near the surface of the sample 14 to be detected and the objective lens assembly 12, more specifically, for example, the deflection control mechanism comprises at least one pair of opposed electrodes and a gap therebetween for passing therethrough the electron beam for scanning. The electrodes of the deflection control mechanism is manufactured by an electrically conductive material having no magnetoconductivity or magnetic permeability, and the deflection control mechanism generates a scanning electric field after a scanning voltage is applied thereon, and the scanning electric field is further coupled with the composite objective field which is of immersed type for deceleration, such that a central axis of the composite objective field which is of immersed type for deceleration of the objective lens assembly 12 swings or translates so as to further reduce the off-axis aberration.

Figure 4:
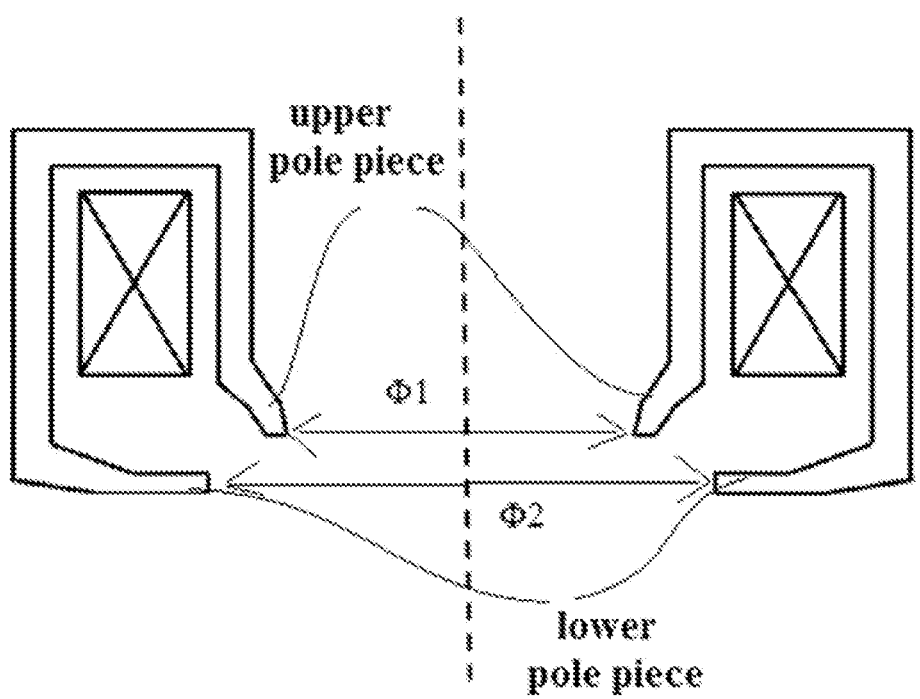
FIG. 4 is a schematic structural view illustrating an objective lens assembly in a scanning electron microscope device according to an alternative embodiment of the present disclosure.

FIG. 4 is a schematic structural view illustrating an objective lens assembly in a scanning electron microscope device 1 according to an alternative embodiment of the present disclosure.

According to an alternative embodiment of the present disclosure, unlike the objective lens assembly which functions as an immersed type magnetic lens having merely a pole piece which is essentially an end of a single inclined portion angled from the radial inner wall of the hollow body of the magnetic yoke towards the optical axis O as illustrated in FIG. 3A, and FIG. 3B, the objective lens assembly as illustrated in FIG. 4 is, for example, a semi-immersed type magnetic lens excited by a current coil, or alternatively a non-immersed type magnetic lens. And the objective lens assembly as illustrated in FIG. 4 comprises an magnetic excitation/induction coil (i.e., magnetization coil) wound by a wire and a housing (i.e., a magnetic yoke) formed by a magnetizer material, and the housing has two inclined portions angled towards the optical axis O (i.e., two inclined portions, each extending inward from a respective one of radial inner wall and radial outer wall of the housing at respective angle with reference to the respective one of radial inner wall and radial outer wall, respectively, and directing towards the optical axis O), and respective ends of the two inclined portions are respectively formed into an upper pole piece and a lower pole piece; and in the direction of the optical axis O, the upper pole piece is located above the lower pole piece and positioned closer to the optical axis O than the lower pole piece. Moreover, a current excitation in the excitation coil resulting in a formation of a magnetic field between the upper and lower pole pieces. The inner diameter of the upper pole piece is $\Phi 1$ while the inner diameter of the lower pole piece is $\Phi 2$. In a condition of $\Phi 1 \geq \Phi 2$, the magnetic field is concentrated between the upper pole piece and the lower pole piece and thus operates with both of the two pole pieces to function as a non-immersed type magnetic lens; and in a condition of $\Phi 1 \leq \Phi 2$, a portion of resulting magnetic field will leak towards the sample to be detected so as to form a semi-immersed type lens.

The technical solution provided by embodiments of the present disclosure has at least one of the following advantages:

By introducing the compensation electrode for dynamic focusing the electron beam and an optional third deflector which cooperates with the use of both the first deflector and the second deflector, the off-axis aberration of the electron beam may be reduced while an off-axis focus field distribution may be corrected simultaneously, and the available field of view (FOV) of scanning images of the electron beam may be expanded, so as to improve detection efficiency of the electron beam. Moreover, the voltage of electrode plates of the compensation electrode for dynamically focusing may float at a relatively higher voltage, which may not only adjust the off-axis focusing field, but also improve the collection rate of secondary electrons. Moreover, by changing the voltage of the first two deflectors (i.e., the first deflector and the second deflector), the electron beam may enter the lens magnetic field at different angles; and then, by changing the excitation of the third deflector and dynamic focusing, images having relatively large available field of view at different incident angles may be obtained.

In addition, according to the foregoing embodiments of the present disclosure, it can be understood that any technical solution formed by any combination of two or more embodiments also falls within the scope of protection of the present disclosure.

It should be understood that, orientation terms in the description of the present disclosure, such as "up", "down", "left", "right", and the like, are used to explain orientation relationship as illustrated in the attached drawings. These orientation terms should not be interpreted as limitation of the scope of protection of the present disclosure.

The embodiments of the present disclosure are described in a progressive manner. Each embodiment focuses on the differences thereof as compared with other embodiments, and the same or similar parts of various embodiments can be referred to each other. In addition, according to the aforementioned embodiments of the present disclosure, it can be understood that any technical solution constructed through a combination of any two or more solutions may also fall within the scope of protection of the present disclosure.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A scanning electron microscope device for a sample to be detected, which is configured to project an electron beam to a surface of the sample to generate backscattered electrons and secondary electrons, comprising:
    an electron beam source configured to emit along an optical axis thereof the electron beam;
    a deflection mechanism, comprising:
        a first deflector located downstream of the electron beam source; and a second deflector located downstream of the first deflector, and an objective lens assembly, comprising:
an excitation coil which is energized to create a magnetic field; and
a magnetic yoke, formed by a magnetizer material as a housing which opens towards the sample, and comprises:
a hollow body defining an internal chamber where the excitation coil is accommodated; and
at least one inclined portion extending inward from the hollow body at an angle with reference to the hollow body and directing towards the optical axis,
with an end of the at least one inclined portion being formed into a pole piece, wherein the deflection mechanism further comprises a compensation electrode in a form of a closed shape that is a curved surface profile that is centrally hollowed and centrally symmetric with respect to the optical axis, which compensation electrode is located between the pole piece and the surface of the sample and is configured to adjust a focusing position of the electron beam at which the electron beam is focused, in a condition of excitation thereof with a voltage being applied thereon, by adjusting the voltage, and wherein the curved surface profile includes a surface that is more proximate to the pole piece being constructed as a cambered surface having a uniform radius.

2. The scanning electron microscope device according to claim 1, wherein a magnitude of the voltage changes in real time with a change in a scanning position over which the electron beam scans, such that the electron beam is focused by a respective portion of the electric field through which a portion of the electron beam deviating from the optical axis passes, into a condition that the electron beam is in a constant in-focus condition across the surface of the sample.

3. The scanning electron microscope device according to claim 2, wherein the voltage floats at a higher voltage than that at the surface of the sample.

4. The scanning electron microscope device according to claim 1, wherein the compensation electrode is in a form of a planar ring shape.

5. The scanning electron microscope device according to claim 1, wherein an intersection point of the cambered surface intersecting with the optical axis is located at the surface of the sample.

6. The scanning electron microscope device according to claim 1, further comprising a third deflector located between the second deflector and the objective lens assembly and disposed in an opening delimited and circumscribed by the pole piece, and each of the first deflector, the second deflector and the third deflector is an electrostatic deflector.

7. The scanning electron microscope device according to claim 1, wherein each of the first deflector and the second deflector comprises a pair of electrodes provided opposite to each other and symmetrically relative to the optical axis, and is applied with respective electric excitation which is adjustable so as to adjust both direction and angle of the electron beam passing through the scanning electron microscope device.

8. The scanning electron microscope device according to claim 1, wherein each of the first deflector and the second deflector is in the form of 8-pole or 12-pole electrostatic deflector, and is applied with respective electric excitation which is adjustable so as to adjust both direction and angle of the electron beam passing through the scanning electron microscope device.

9. The scanning electron microscope device according to claim 6, wherein each of the first deflector, the second deflector and the third deflector comprises a pair of electrodes provided opposite to each other and symmetrically relative to the optical axis, and is applied with respective electric excitation which is adjustable so as to adjust both direction and angle of the electron beam passing through the scanning electron microscope device.

10. The scanning electron microscope device according to claim 6, wherein each of the first deflector, the second deflector and the third deflector is in the form of 8-pole or 12-pole electrostatic deflector, and is applied with respective electric excitation which is adjustable so as to adjust both direction and angle of the electron beam passing through the scanning electron microscope device.

11. The scanning electron microscope device according to claim 10, wherein the pole piece is an end of the inclined portion of the magnetic yoke substantially disposed parallel to the optical axis, and a length of each electrode of the third deflector is of the same order of magnitude as a thickness of the pole piece but is not smaller than the thickness of the pole piece.

12. The scanning electron microscope device according to claim 6, wherein the first deflector, the second deflector and the third deflector are arranged coaxially with each other or one another along the optical axis.

13. The scanning electron microscope device according to claim 10, wherein electrodes of the third deflector are arranged at a predetermined angle relative to electrodes of the first deflector, and the predetermined angle is set such that an off-axis aberration of the electron beam which is subject to deflection applied by the third deflector is minimized.

14. The scanning electron microscope device according to claim 6, wherein the third deflector is formed by a non-magnetizer material which is electrically conductive.

15. The scanning electron microscope device according to claim 6, wherein the inclined portion of the objective lens assembly defines an electron beam channel shrinking towards the sample, with a portion of the electron beam channel at the third deflector being a gap defined between the electrodes of the third deflector in a diameter direction thereof.

16. An electron beam inspection apparatus, comprising:
the scanning electron microscope device according to claim 1;
a first detector located downstream the sample and configured to detect backscattered electrons generated by the electron beam incident on the surface of the sample; and
a second detector located downstream of the sample and configured to detect secondary electrons generated by the electron beam incident on the surface of the sample.

17. The scanning electron microscope device according to claim 11, wherein the length of each electrode of the third deflector is equal to the thickness of the pole piece.

18. A scanning electron microscope device for a sample to be detected, which is configured to project an electron beam to a surface of the sample to generate backscattered electrons and secondary electrons, comprising:
an electron beam source configured to emit along an optical axis thereof the electron beam;
a deflection mechanism, comprising:

a first deflector comprising a pair of electrodes and located downstream of the electron beam source; and a second deflector located downstream of the first deflector, and an objective lens assembly, comprising:

an excitation coil which is energized to create a magnetic field; and a magnetic yoke, formed by a magnetizer material as a housing which opens towards the sample, and comprises:

a hollow body defining an internal chamber where the excitation coil is accommodated; and at least one inclined portion extending inward from the hollow body at an angle with reference to the hollow body and directing towards the optical axis, with an end of the at least one inclined portion being formed into a pole piece, and a third deflector comprising a pair of electrodes and located between the second deflector and the objective lens assembly and disposed in an opening delimited and circumscribed by the pole piece, wherein each of the first deflector, the second deflector and the third deflector is an electrostatic deflector, wherein the deflection mechanism further comprises a compensation electrode, which is located between the pole piece and the surface of the sample and is configured to adjust a focusing position of the electron beam at which the electron beam is focused, in a condition of excitation thereof with a voltage being applied thereon, by adjusting the voltage, and wherein:

the pole piece is an end of the inclined portion of the magnetic yoke substantially disposed parallel to the optical axis, and a length of each electrode of the third deflector is of the same order of magnitude as a thickness of the pole piece but is not smaller than the thickness of the pole piece; or the electrodes of the third deflector are arranged at a predetermined angle relative to electrodes of the first deflector, and the predetermined angle is set such that an off-axis aberration of the electron beam which is subject to deflection applied by the third deflector is minimized.

\* \* \* \* \*